(12) United States Patent
Elazhary et al.

(10) Patent No.: US 11,531,280 B2
(45) Date of Patent: Dec. 20, 2022

(54) COMPACT ALIGNMENT SENSOR ARRANGEMENTS

(71) Applicants: ASML Holding N.V., Veldhoven (NL); ASML Netherlands B.V., Veldhoven (NL)

(72) Inventors: Tamer Mohamed Tawfik Ahmed Mohamed Elazhary, New Canaan, CT (US); Justin Lloyd Kreuzer, Trumbull, CT (US); Franciscus Godefridus Casper Bijnen, Valkenswaard (NL); Krishanu Shome, Cheshire, CT (US)

(73) Assignees: ASML HOLDING N.V., Veldhoven (NL); ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/271,684

(22) PCT Filed: Aug. 22, 2019

(86) PCT No.: PCT/EP2019/072433
§ 371 (c)(1),
(2) Date: Feb. 26, 2021

(87) PCT Pub. No.: WO2020/043582
PCT Pub. Date: Mar. 5, 2020

(65) Prior Publication Data
US 2021/0318627 A1    Oct. 14, 2021

Related U.S. Application Data

(60) Provisional application No. 62/724,198, filed on Aug. 29, 2018.

(51) Int. Cl.
*G03F 9/00* (2006.01)
*G03F 7/20* (2006.01)

(52) U.S. Cl.
CPC ........ *G03F 9/7088* (2013.01); *G03F 7/70775* (2013.01); *G03F 9/7049* (2013.01); *G03F 9/7076* (2013.01)

(58) Field of Classification Search
CPC .. G03F 7/70775; G03F 9/7049; G03F 9/7076; G03F 9/7088
See application file for complete search history.

(56) References Cited

U.S. PATENT DOCUMENTS 5,204,535 A    4/1993  Mizutani
5,333,050 A *  7/1994  Nose ..................... G03F 9/7049
                                          356/490
(Continued)

FOREIGN PATENT DOCUMENTS

CN    104111594 A    10/2014
EP    1 372 040 A2   12/2003
(Continued)

OTHER PUBLICATIONS

International Search Report and Written Opinion of the International Searching Authority directed to related International Patent Application No. PCT/EP2019/072433, dated Dec. 12, 2019; 10 pages.
(Continued)

*Primary Examiner* — Peter B Kim
(74) *Attorney, Agent, or Firm* — Sterne, Kessler, Goldstein & Fox P.L.L.C.

(57) ABSTRACT

An apparatus and system for determining alignment of a substrate in which a periodic alignment mark is illuminated with spatially coherent radiation which is then provided to a compact integrated optical device to create self images of the alignment mark which may be manipulated (e.g., mirrored, polarized) and combined to obtain information on the position of the mark and distortions within the mark. Also disclosed is a system for determining alignment of a sub- (Continued)

strate in which a periodic alignment mark is illuminated with spatially coherent radiation which is then provided to an optical fiber arrangement to obtain information such as the position of the mark and distortions within the mark.

18 Claims, 10 Drawing Sheets

(56) References Cited

U.S. PATENT DOCUMENTS

| | | | |
|---|---|---|---|
| 6,297,876 B1 | 10/2001 | Bornebroek | |
| 6,961,116 B2 | 11/2005 | Den Boef et al. | |
| 8,610,898 B2 | 12/2013 | Khuat Duy | |
| 9,223,227 B2 | 12/2015 | Bhattacharyya et al. | |
| 9,303,978 B2 | 4/2016 | Den Boef | |
| 9,606,442 B2 | 3/2017 | Mathijssen et al. | |
| 9,970,747 B2 | 5/2018 | Kreuzer et al. | |
| 10,247,940 B2 | 4/2019 | Sobolev | |
| 2004/0263860 A1 | 12/2004 | Johnson | |
| 2011/0141451 A1* | 6/2011 | Yamaguchi | G01D 5/38 356/494 |
| 2012/0057171 A1 | 3/2012 | Khuat Duy | |
| 2016/0061750 A1 | 3/2016 | Den Boef et al. | |
| 2016/0223920 A1* | 8/2016 | Tinnemans | G03F 9/7088 |
| 2017/0097574 A1 | 4/2017 | Goodwin et al. | |

FOREIGN PATENT DOCUMENTS

| | | |
|---|---|---|
| EP | 2 434 594 A1 | 3/2012 |
| JP | 2012-169617 A | 9/2012 |
| JP | 2012-175103 A | 9/2012 |
| JP | 2015-518654 A | 7/2015 |
| JP | 2015-525883 A | 9/2015 |
| JP | 2019-505831 A | 2/2019 |
| WO | WO 2018/045557 A1 | 3/2018 |
| WO | WO 2018/146456 A1 | 8/2018 |

OTHER PUBLICATIONS

Soldano et al., "Optical Multi-Mode Interference Devices Based on Self Imaging: Principles and Applications," Journal of Lightwave Technology, vol. 13, No. 4, Apr. 1995; pp. 615-627.

* cited by examiner

COMPACT ALIGNMENT SENSOR ARRANGEMENTS

CROSS-REFERENCE TO RELATED APPLICATIONS

This application claims priority of U.S. Provisional Patent Application No. 62/724,198, which was filed on Aug. 29, 2018, and which is incorporated herein in its entirety by reference.

FIELD

The present disclosure relates to the manufacture of devices using lithographic techniques. Specifically, the present disclosure relates to devices for sensing and analyzing alignment marks on reticles and wafers to characterize and control semiconductor photolithographic processes.

BACKGROUND

A lithographic apparatus can be used, for example, in the manufacture of integrated circuits (ICs). For that application, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

ICs are built up layer by layer, and modern ICs can have 30 or more layers. On Product Overlay (OPO) is a measure of a system's ability to print these layers accurately on top of each other. Successive layers or multiple processes on the same layer must be accurately aligned to the previous layer. Otherwise, electrical contact between structures will be poor and the resulting devices will not perform to specification. Good overlay improves device yield and enables smaller product patterns to be printed. The overlay error between successive layers formed in or on the patterned substrate is controlled by various parts of the exposure apparatus of the lithographic apparatus.

Process-induced wafer errors are a significant impediment to OPO performance. Process-induced wafer errors are attributable to the complexity of printed patterns as well as an increase of the number of printed layers. This error is of relatively high spatial variation that is different from wafer to wafer, and within a given wafer.

In order to control the lithographic process to place device features accurately on the substrate, one or more alignment marks are generally provided on, for example, the substrate, and the lithographic apparatus includes one or more alignment sensors by which the position of the mark may be measured accurately. The alignment sensor may be effectively a position measuring apparatus. Different types of marks and different types of alignment sensors are known from different times and different manufacturers. Measurement of the relative position of several alignment marks within the field can correct for process-induced wafer errors. Alignment error variation within the field can be used to fit a model to correct for OPO within the field Lithographic apparatus are known to use multiple alignment systems to align the substrate with respect to the lithographic apparatus. The data can for example be obtained with any type of alignment sensor, for example a SMASH (SMart Alignment Sensor Hybrid) sensor, as described in U.S. Pat. No. 6,961,116, issued Nov. 1, 2005 and titled "Lithographic Apparatus, Device Manufacturing Method, and Device Manufactured Thereby," which is hereby incorporated by reference herein in its entirety, that employs a self-referencing interferometer with a single detector and four different wavelengths, and extracts the alignment signal in software, or ATHENA (Advanced Technology using High order ENhancement of Alignment), as described in U.S. Pat. No. 6,297,876, issued Oct. 2, 2001 and titled "Lithographic Projection Apparatus with an Alignment System for Aligning Substrate on Mask," which is hereby incorporated by reference in its entirety, which directs each of seven diffraction orders to a dedicated detector.

Reference is made in particular to the European application No. EP 1 372 040 A1, granted Mar. 5, 2008 and titled "Lithographic Apparatus and Device Manufacturing Method" which document is hereby incorporated by reference in its entirety. EP 1 372 040 A1 describes an alignment system using a self-referencing interferometer that produces two overlapping images of an alignment marker. These two images are rotated over 180° with respect to each other. EP 1 372 040 A1 further describes the detection of the intensity variation of the interfering Fourier transforms of these two images in a pupil plane. These intensity variations correspond to a phase difference between different diffraction orders of the two images, and from this phase difference positional information is derived, which is required for the alignment process. Reference is also made to U.S. Pat. No. 8,610,898, "Self-Referencing Interferometer, Alignment System, and Lithographic Apparatus" issued Dec. 17, 2013, the entire contents of which are hereby incorporated by reference in their entirety.

Existing alignment systems and techniques are subject to certain drawbacks and limitations. For example, they are generally incapable of measuring distortions within the alignment mark field, i.e., intra-field distortion. These systems are also in general relatively bulky. They also do not support finer alignment grating pitches, for example, grating pitches less than about 1 um. There thus remains a need for an alignment sensor capable of nanometer precision alignment to an alignment grating mark printed on the wafer.

Also, it is desirable to enable the use of a larger number of alignment marks because the use of a greater number of alignment marks offers the possibility of greater alignment precision. Current alignment sensors, however, typically can measure only one position of one alignment mark at a time. Therefore trying to measure the position of many marks using current alignment sensor technology would result in significant time and throughput penalties. It is thus desirable to have a sensor that can be used in arrangements that measure multiple alignment marks simultaneously.

There is thus a need for a compact alignment sensor capable of measuring intra field distortion that can support finer alignment grating pitches and measure multiple marks simultaneously.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect of an embodiment there is disclosed a system for determining alignment of a substrate in which a periodic alignment mark is illuminated with spatially coherent radiation to create self images of the alignment mark which may be manipulated (e.g., mirrored, polarized) and combined to provide information on the position of, and any intra-mark distortion within, the mark.

According to an aspect of an embodiment there is disclosed an apparatus for sensing an alignment pattern comprising a grating on a substrate, the apparatus comprising at least one light source for generating a first beam of coherent radiation illuminating a portion of the grating from a first angle and a second beam of coherent radiation illuminating the portion of the grating from a second angle, the first and second beams being diffracted by the portion of the grating, and a multimode interference device comprising a first input port arranged to receive a positive diffraction order of the first beam and a positive diffraction order of the second beams as diffracted by the grating portion, a second input port arranged to receive a negative diffraction order of the first beam and a negative diffraction order of the second beam as diffracted by the grating portion, a first output port arranged to output a first spatially overlapped image comprising an image of the grating portion as illuminated by the first beam and a minor image of the grating portion as illuminated by the second beam, and a second output port arranged to output a second spatially overlapped image comprising an image of the grating portion as illuminated by the second beam and a minor image of the grating portion as illuminated by the first beam. The apparatus may further comprise a first detector arranged to receive the first spatially overlapped image and to generate a first signal indicative of an intensity of the first spatially overlapped image and a second detector arranged to receive the second spatially overlapped image and to generate a second signal indicative of an intensity of the second spatially overlapped image. The apparatus may further comprise a processor arranged to receive the first signal the second signal and configured to determine a characteristic of the portion of the grating based at least in part on the first signal and the second signal.

According to an aspect of an embodiment there is also disclosed an apparatus for sensing an alignment pattern comprising a grating on a substrate, the apparatus comprising at least one light source for generating a first beam of coherent radiation illuminating a portion of the grating from a first angle and a second beam of coherent radiation illuminating the portion of the grating from a second angle, the first and second beams being diffracted by the portion of the grating, and a plurality of multimode interference devices, each of the multimode interference devices being arranged adjacent to a respective segment of the grating portion and comprising a first input port arranged to receive a positive diffraction order of the first beam and a positive diffraction order of the second beam as diffracted by the respective segment of the grating portion, a second input port arranged to receive a negative diffraction order of the first beam and a negative diffraction order of the second beam as diffracted by the respective segment of the grating portion, a first output port arranged to output a first spatially overlapped image comprising an image of the segment of grating portion as illuminated by the first beam and a minor image of the segment of the grating portion as illuminated by the second beam, and a second output port arranged to output a second spatially overlapped image comprising an image of the segment of the grating portion as illuminated by the second beam and a minor image of the segment of the grating portion as illuminated by the first beam. The plurality of multimode interference devices may be arranged in a linear array parallel to the portion of the grating. The apparatus may further comprise a plurality of first detectors respectively arranged to receive the first spatially overlapped images and to generate first signals indicative of intensities of the first spatially overlapped images and a plurality of a second detectors respectively arranged to receive the second spatially overlapped images and to generate second signals indicative of intensities of the second spatially overlapped images. The apparatus may further comprise a processor arranged to receive the first signals the second signals and configured to determine a characteristic of the portion of the grating based at least in part on the first signals and the second signals.

According to an aspect of an embodiment there is also disclosed an apparatus comprising at least one light source for generating a first beam of coherent radiation illuminating a portion of the grating from a first angle and a second beam of coherent radiation illuminating the portion of the grating from a second angle, the first and second beams being diffracted by the portion of the grating and an optical fiber based device comprising a first input port arranged to receive a positive diffraction order of the first beam and a positive diffraction order of the second beam as diffracted by the grating portion, a second input port arranged to receive a negative diffraction order of the first beam and a negative diffraction order of the second beam as diffracted by the grating portion a first output port arranged to output a first spatially overlapped image comprising a p-polarized image from the negative diffraction orders and an s-polarized image from the positive diffraction orders, and a second output port arranged to output a second spatially overlapped image comprising an s-polarized image from the negative diffraction orders and a p-polarized image from the positive diffraction orders. The apparatus may further comprise a first detector arranged to receive the first spatially overlapped image and to generate a first signal indicative of an intensity of the first spatially overlapped image and a second detector arranged to receive the second spatially overlapped image and to generate a second signal indicative of an intensity of the second spatially overlapped image. The apparatus may further comprise a processor arranged to receive the first signal the second signal and configured to determine a characteristic of the portion of the grating based at least in part on the first signal and the second signal.

According to an aspect of an embodiment there is also disclosed an apparatus comprising at least one light source for generating a first beam of coherent radiation illuminating a portion of the grating from a first angle and a second beam of coherent radiation illuminating the portion of the grating from a second angle, the first and second beams being diffracted by the portion of the grating and a plurality of an optical fiber based devices each arranged adjacent to a respective segment of the grating portion and comprising a first input port arranged to receive a positive diffraction order of the first beam and a positive diffraction order of the second beam as diffracted by the grating portion, a second input port arranged to receive a negative diffraction order of the first beam and a negative diffraction order of the second beam as diffracted by the grating portion, a first output port arranged to output a first spatially overlapped image comprising a p-polarized image from the negative diffraction orders and an s-polarized image from the positive diffraction orders, and a second output port arranged to output a second spatially overlapped image comprising an s-polarized image from the negative diffraction orders and a p-polarized image from the positive diffraction orders. The plurality of optical fiber based devices may be arranged in a linear array parallel to the portion of the grating. The apparatus may further comprise a plurality of first detectors respectively arranged to receive the first spatially overlapped images and to generate first signals indicative of intensities of the first spatially overlapped images and a plurality of a second detectors respectively arranged to receive the second spatially overlapped images and to generate second signals indicative of intensities of the second spatially overlapped images. The apparatus may further comprise a processor arranged to receive the first signals the second signals and configured to determine a characteristic of the portion of the grating based at least in part on the first signals and the second signals.

According to an aspect of an embodiment there is also disclosed an apparatus for sensing an alignment pattern comprising a grating on a substrate, the apparatus comprising at least one light source for generating first and second illumination beams illuminating at least a portion of the grating, a first input optical element arranged to receive a positive diffraction order of the first beam and a positive diffraction order of the second beam as diffracted by the grating, a second input optical element arranged to receive a negative diffraction order of the first beam and a negative diffraction order of the second beam as diffracted by the grating, a first imaging optical element optically coupled to the first input optical element for generating a first image based on the positive diffraction orders, a second imaging optical element optically coupled to the second input optical element for generating a second image based on the negative diffraction orders, a first transforming optical element for transforming the first image to generate a first transformed image, a second transforming optical element for transforming the second image to generate a second transformed image, a first combining optical element for spatially overlapping the first image and the second transformed image, and a second combining optical element for spatially overlapping the second image and the first transformed image.

According to an aspect of an embodiment there is also disclosed an apparatus for sensing an alignment pattern comprising a grating on a substrate, the apparatus comprising at least one light source for generating at least one beam of coherent radiation illuminating a portion of the grating, the at least one beam being diffracted by the portion of the grating to produce a diffracted beam and a multimode interference device comprising a first input port arranged to receive a positive diffraction order of the diffracted beam, a second input port arranged to receive a negative diffraction order of the diffracted beam, a first output port arranged to output a first spatially overlapped image, and a second output port arranged to output a second spatially overlapped image. The at least one light source may illuminate the portion of the grating on axis or off axis. The first input port may comprise a first single mode waveguide and the second input port comprises a second single mode waveguide. The first input port may comprise a first subwavelength structure and the second input port may comprise a second subwavelength structure.

Further embodiments, features, and advantages of the present invention, as well as the structure and operation of the various embodiments are described in detail below with reference to accompanying drawings.

BRIEF DESCRIPTION OF THE DRAWING

The accompanying drawings, which are incorporated herein and form part of the specification, illustrate the methods and systems of embodiments of the invention by way of example, and not by way of limitation. Together with the detailed description, the drawings further serve to explain the principles of and to enable a person skilled in the relevant art(s) to make and use the methods and systems presented herein. In the drawings, like reference numbers indicate identical or functionally similar elements.

Figure 1:
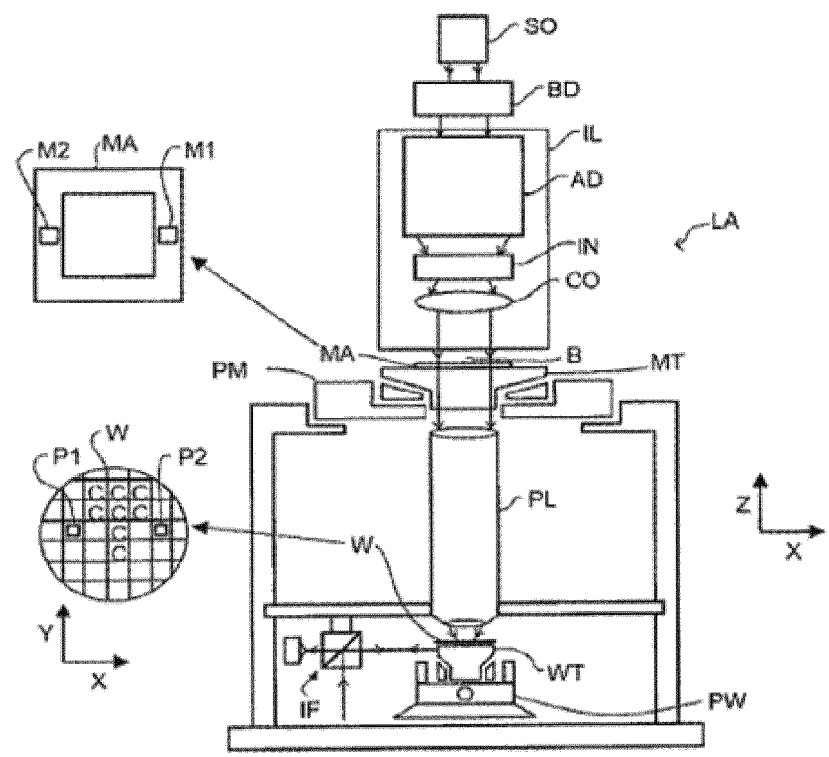
FIG. 1 depicts selected parts of a photolithography system such as could be used to according to aspects of an embodiment disclosed herein.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments. The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include solid state memory, read only memory (ROM), random access memory (RAM), magnetic disk storage media, optical storage media, flash memory devices; electrical, optical, acoustical or other forms of propagated signals (e.g., carrier waves, infrared signals, digital signals, etc.), and others. Further, firmware, software, routines, and instructions may be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts a lithographic apparatus. The apparatus comprises an illumination system (illuminator) IL configured to condition a radiation beam B (e.g., UV radiation or other suitable radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, electromagnetic, and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies. The wafer may also include additional marks such as, for example, marks that are sensitive to variations in a chemical mechanical planarization (CMP) process used as a step in wafer fabrication.

The target P1 and/or P2 on substrate W may be, for example, (a) a resist layer grating, which is printed such that after development, the bars are formed of solid resist lines, or (b) a product layer grating, or (c) a composite grating stack in an overlay target structure comprising a resist grating overlaid or interleaved on a product layer grating. The bars may alternatively be etched into the substrate.

Figure 2:
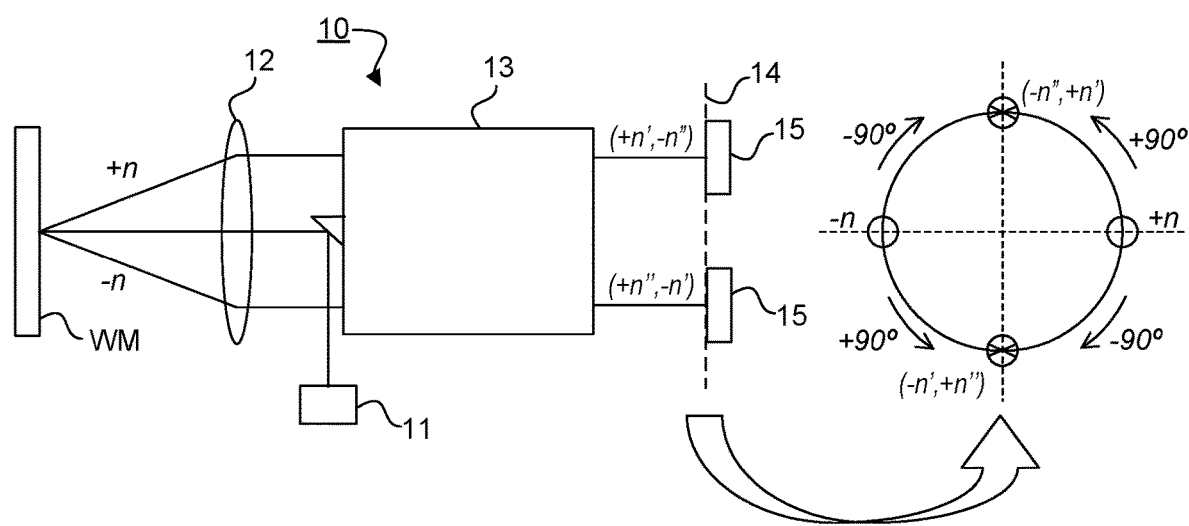
FIG. 2 depicts selected parts of a known alignment system for explaining the principles of its operation.

FIG. 2 shows a schematic overview of a known alignment system 10. A light source 11 emits a spatially coherent beam of radiation which illuminates an alignment marker WM on a substrate (e.g., a wafer) which reflects the radiation into positive and negative diffraction orders +n and −n. These diffraction orders are collimated by an objective lens 12 and enter a self-referencing interferometer 13. The self-referencing interferometer outputs two images of the input with a relative rotation of 180° and which overlap and which can therefore be made to interfere. In a pupil plane 14, the overlapping Fourier transforms of these images, with the different diffraction orders separated can be seen and be made to interfere. Detectors 15 in the pupil plane detect the interfered diffraction orders to provide positional information. Based on this positional information a substrate can be aligned accurately with respect to a lithographic apparatus. The right-hand part of FIG. 2 shows the formation of two overlapping images in the pupil plane 14; for one image +n' and −n' are rotated by +90° relative to the input diffraction orders +n and −n; for the other image +n" and −n" are rotated by −90° relative to the input diffraction orders +n and −n. In the pupil plane the orders of respectively (+n' and −n"), and (+n" and −n') interfere.

A disadvantage of the known alignment systems is that they are relatively expensive as their optical design can require the use of specially manufactured optical components. A further disadvantage of the known alignment systems is that the known self-referencing interferometer is usually quite bulky.

Figure 3:
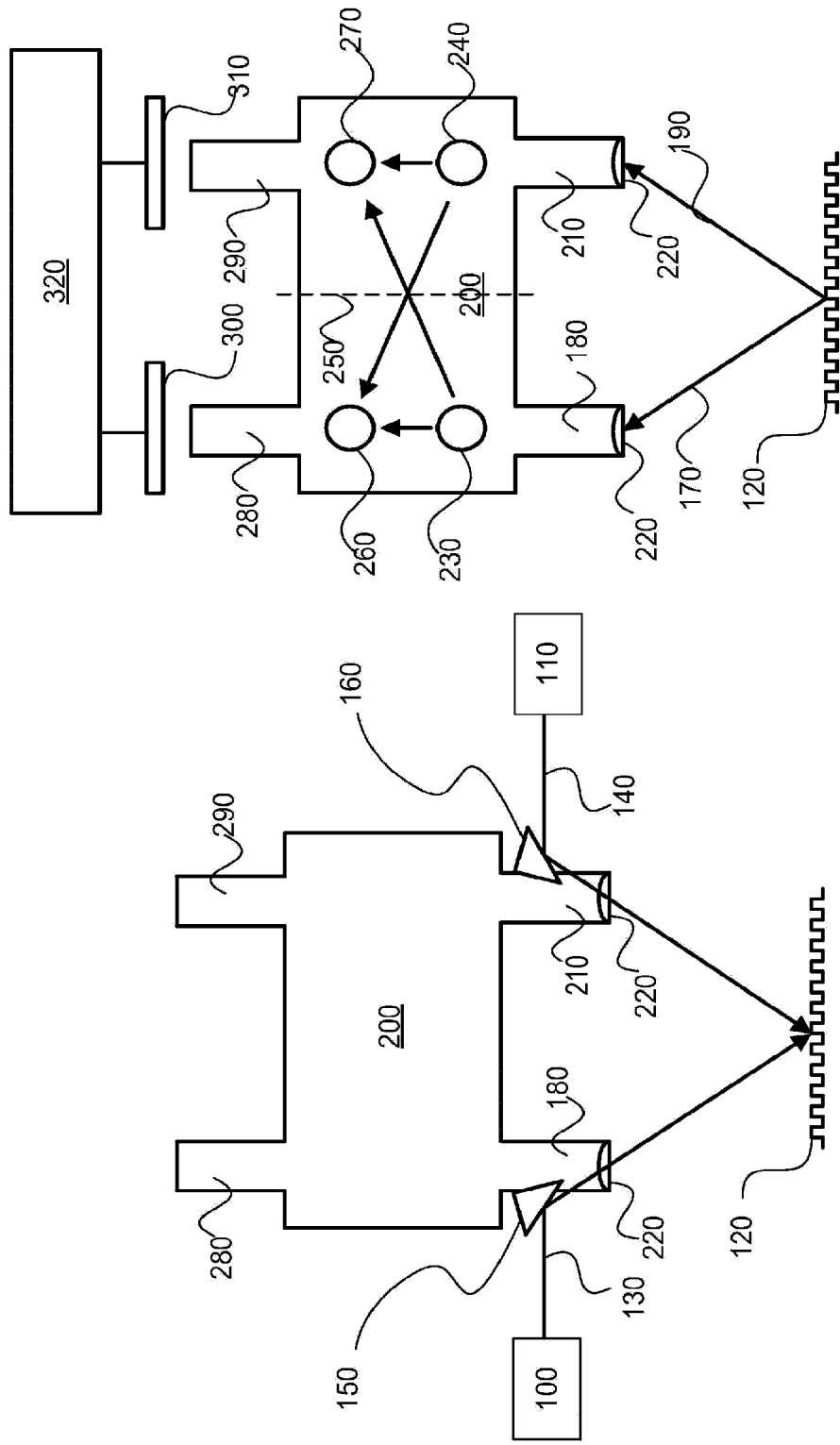
FIGS. 3A and 3B depict multimode interference device based alignment sensor according to an aspect of an embodiment disclosed herein.

FIG. 3A shows an alignment sensor according to one aspect of an embodiment. FIG. 3A shows a first light source 100 and a second light source 110 arranged to illuminate one or more gratings in the alignment mark 120, e.g., TIS or PARIS plate. The first light source 100 generates a first beam 130 of coherent light and the second light source 110 generates a second beam 140 of coherent light. Although the first light source 100 and the second light source 110 are shown as being separate light sources, it will be understood by one of ordinary skill in the art that the first beam 130 and the second beam 140 may be formed by dividing a single beam to provide coherence between the first beam 130 and the second beam 140.

A first reflector 150 reflects the first beam 130 along a first path onto the alignment mark 120 where the grating in the alignment mark 120 diffracts the first beam 130. A second reflector 160 reflects the second beam 140 along a second path onto the alignment mark 120 where the grating in the alignment mark 120 diffracts the second beam 140. Light 170 from one+order of the first beam diffraction and one+ order of the second beam diffraction travels along the first path to a first single mode channel 180 of a multimode interference device (MMI) 200. Light 190 from one−order of the first beam diffraction and another−order of the second beam diffraction travels along the second path to a second single mode channel 210 of the MMI 200. In this regard, see also FIG. 3B. Although this description is divided into two figures so the beam paths can be seen separately, it will be understood that the illumination and the reception of the diffraction orders by the MMI 200 occur essentially together continuously rather than sequentially.

The illumination light is thus in the form of two illuminating beams impinging on the alignment grating mark from two different directions, reciprocal to the light directions used for detection. It is necessary to maintain a stable phase difference between the two illuminating beams 130 and 140. This can be achieved, for example, in the case of where the beams 130 and 140 are produced by a laser with a resonant cavity, by using an actuator such as a piezoelectric device to apply a force to and control the length of the cavity.

Thus a light source emits a spatially coherent beam of radiation which illuminates an alignment marker 120 on a substrate (e.g., a wafer) which reflects the radiation into diffraction orders. These diffraction orders are collimated by lenses or curved surfaces 220 and enter the MMI 200.

A periodic structure image such as the alignment grating 120, when illuminated with a coherent light source, is reproduced at certain regular distances away from the grating. These principles are described, for example, in Lucas B. Soldano et al., "Optical Multi-Mode Interference Devices Based on Self Imaging: Principles and Applications," Journal of Lightwave Technology, Vol. 13, No. 4 (April 1995), the contents of which are hereby incorporated by reference in their entirety. This phenomenon is put to use in multimode interference devices. Interference between modes inside the MMI reproduces self-images of the incident field. In other words, self imaging is a property of multimode waveguides by which an input field profile is reproduced in single or multiple images at periodic intervals along the propagation direction of the guide.

In the arrangement shown, the length of the MMI 200 is adjusted such that a first self image 230 appears at the position shown in FIG. 3B and a second self image 240 appears at the position shown in FIG. 3B. These images are then mirrored about minor axis 250 and combined so that an first overlap image 260 of self image 230 and a 180° minor of self image 240 appears at the position shown and second overlap image 270 of self image 240 and a 180° minor of self image 230 appears at the position shown. Thus minoring and superposition results in spatially overlapped diffraction orders similar to what occurs in a self referencing interferometer.

The first overlap image 260 and the second overlap image 270 are coupled out of the MMI 200 through first and second single mode waveguides 280 and 290, respectively. A first detector 300 receives the first overlap image 260 and a second detector 310 receives the second overlap image 270. Raw scan signals developed by the first detector 300 and the second detector 310 are received directly or indirectly by a processor 320. The raw scan signal may be processed to extract information about the surface that was scanned. For example, the relative phase between spatially overlapped diffraction order pairs changes with scanning through the mark which results in a modulating signal, from which the aligned position error can be determined.

The MMI 200 collects ±diffraction orders reflected off the grating as it is being translated with respect to a sensor. The MMI length maybe set to create a double image at the output ports 280 and 290. The output ports 280 and 290 act as a coherent summation channel and a coherent difference channel, respectively, separated by a 180 degree phase difference.

Figure 4:
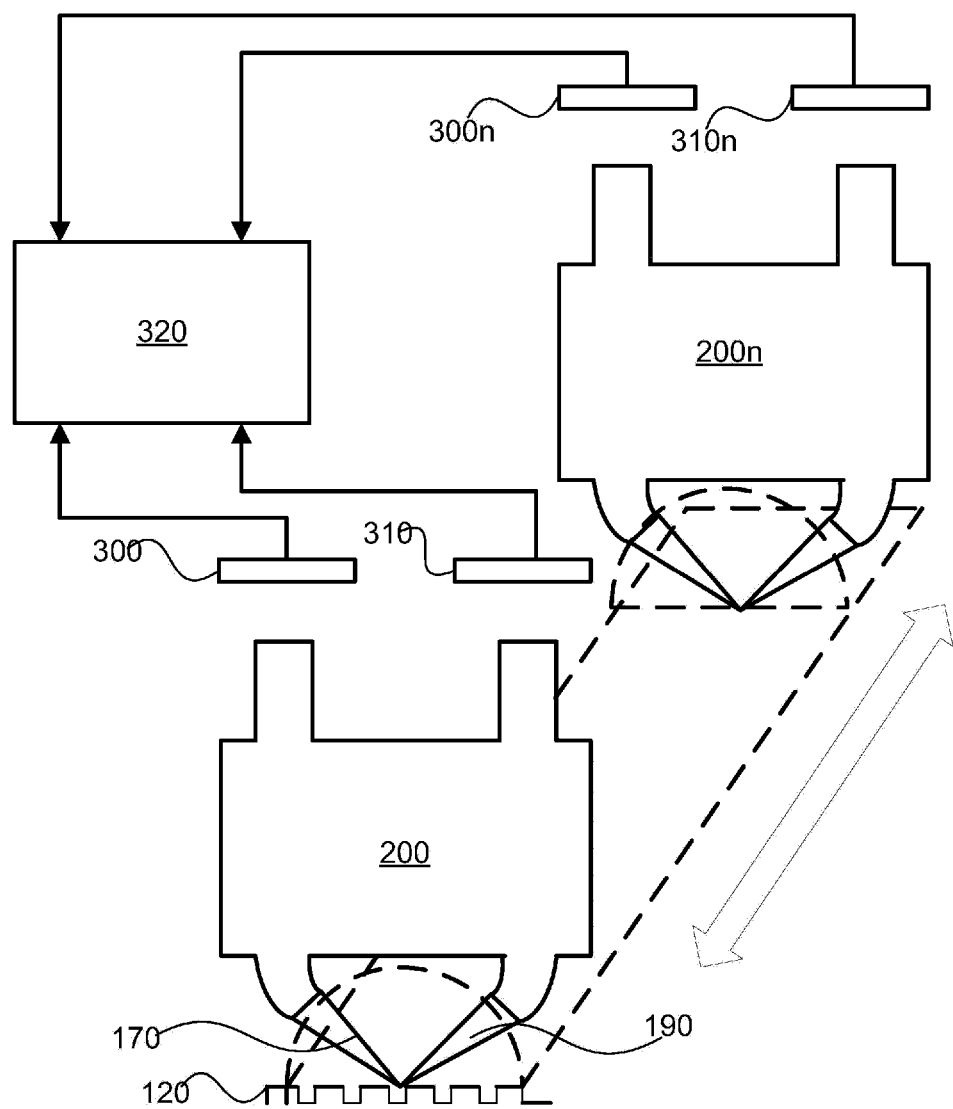
FIG. 4 depicts a linear array of alignment sensors according to an aspect of an embodiment disclosed herein.

One advantage to the described arrangement is that it can be made to be very compact as compared to existing alignment sensors and so multiple sensors can be arrayed in parallel to cover any field on the wafer. This is shown in FIG. 4. The linear array of N alignment sensors MMI 300-300*n* extends in the direction of the arrow across the width of the alignment grating 120 to capture the diffraction radiation via single mode waveguides 180-180*n* and 210-210*n* that excite the respective MMI waveguide. As above a lens or simply a curved surface can be used to match waveguide fundamental mode. The parallel sensors thus arrayed can collectively cover a wider field of view, that is, perform simultaneous alignment of multiple marks to correct for intra field distortion. It also permits the use of alignment grating pitches smaller than 1 um.

The arrangement shown in the figures yields a coherent summation channel. Adjusting the MMI 200 by, for example, adding a 7E phase delay line can yield a coherent summation channel and a coherent difference channel. Also, it will be stood that other or additional diffraction orders can be collected by positioning of the single mode channels of the MMI 200.

The novel alignment sensors described above can be fabricated using lithography fabrication techniques and so are easier to fabricate than alignment sensors using conventional optical elements such as lenses and mirrors that require precision grinding and polishing. Thus the fabrication of the novel alignment sensors is also less expensive.

In addition to shown illumination scheme, illumination can be realized using, for example, a lens, an optical fiber, another MMI, etc. In general, the illumination arrangement may provide illumination on-axis (essentially at a right angle to the grating) and off-axis (at an oblique angle to the grating). Off-axis illumination permits obtaining alignment information from smaller (finer pitch) diffraction gratings.

Figure 5A:
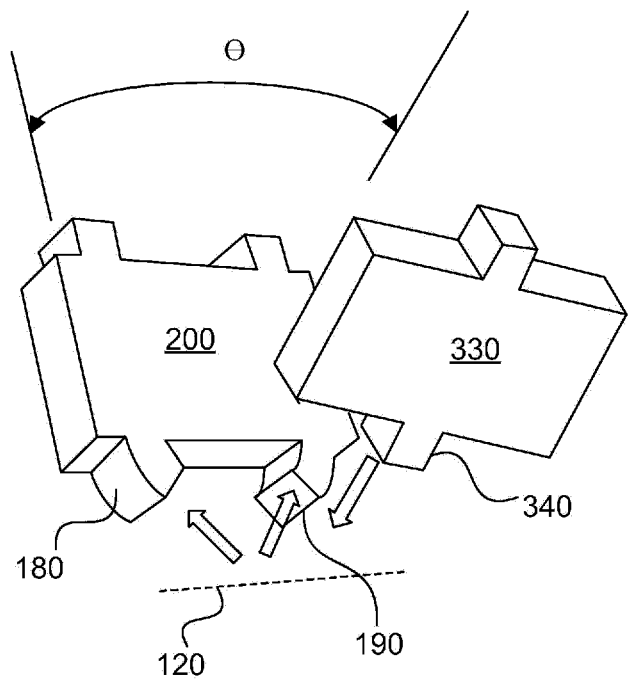
FIGS. 5A and 5B depict an arrangements of an MMI illumination device and an MMI detector according to an aspect of an embodiment disclosed herein.

FIG. 5A shows an arrangement in which an illumination MMI 330 is used to provide on-axis illumination to the alignment mark 120 through a single mode output coupler 340. The diffraction orders of light diffracted by the alignment mark 120 are coupled into a collection MMI 200 through single mode input ports 180 and 190. The collection MMI 200 and the illumination MMI 330 are angled away from each other by a relatively small angle θ.

Figure 5B:
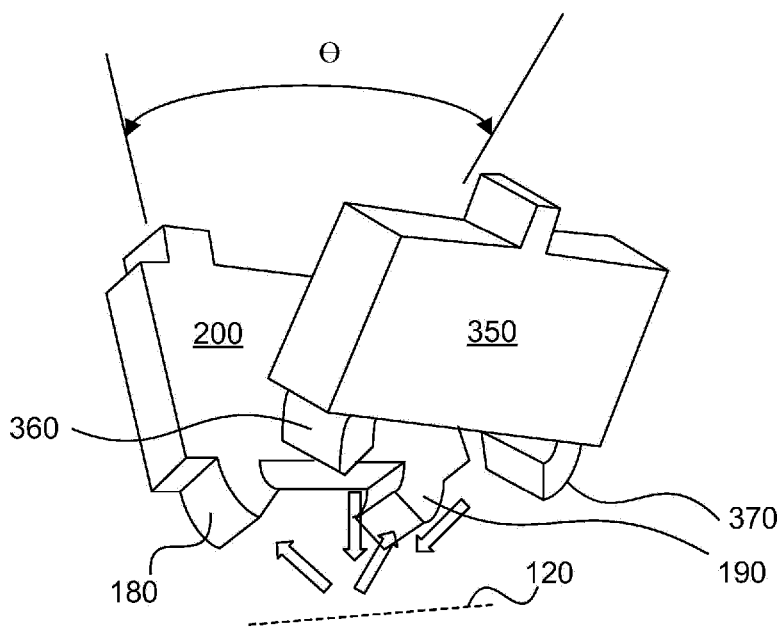

FIG. 5B shows an arrangement in which an illumination MMI 350 is used to provide off-axis illumination to an alignment mark 120 through single mode output ports 360 and 370. The diffraction orders of light diffracted by the alignment mark 120 are coupled into a collection MMI 200 through single mode input ports 180 and 190. The collection MMI 200 and the illumination MMI 350 are angled away from each other by a relatively small angle θ.

Operation over an extended range of wavelengths may be achieved by using subwavelength structures or a grating designed to couple light into and out of the MMI instead of single mode waveguide input and output ports. A multimode fiber can be used to collect light from the output ports to a photo detector that is placed far away from the optics. To accommodate different grating pitches, additional sensors can be made with the appropriate design of the multimode waveguide length with the appropriate spacing between input and output ports. A one-by-one (1×1) illumination MMI can be used to illuminate the wafer alignment grating, with the illumination beam being few degrees off normal incidence.

Figure 6:
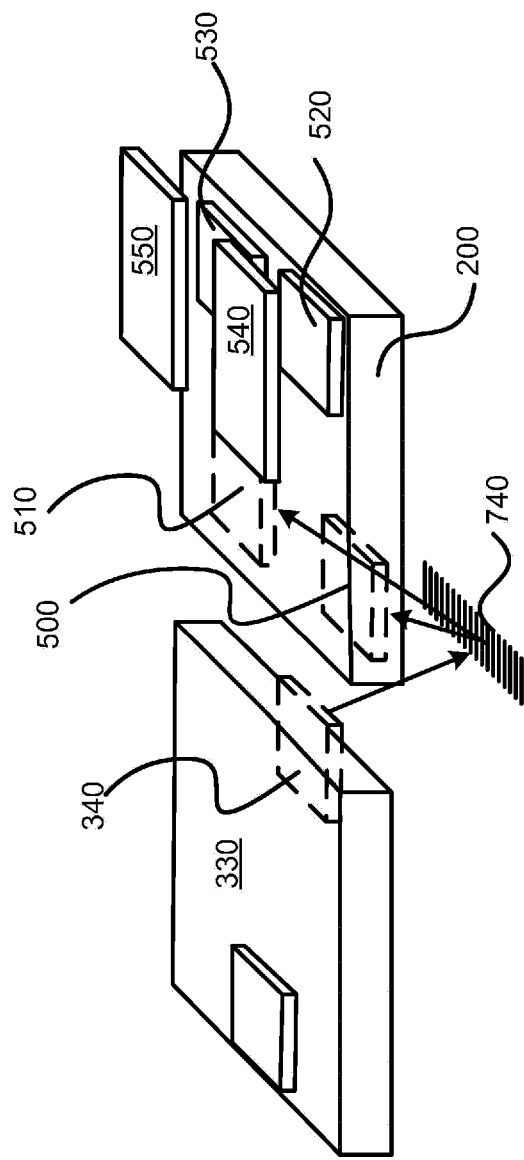
FIG. 6 depicts another arrangement of an MMI illumination device and an MMI detector according to an aspect of an embodiment disclosed herein.

Such an arrangement is shown in FIG. 6. An illumination MMI 330 is used to illuminate the alignment mark 740. The illumination beam from the output coupler 340 is only a few degrees off normal incidence. The positive diffraction order impinges on a coupler 500 which is configured as a sub-wavelength structure or grating which couples light into the detection MMI 200. The negative diffraction order impinges on a coupler 510 which is also configured as a subwavelength structure or grating. The diffraction order pairs appear at couplers 520, 530 which are also configured as a sub-wavelength structure or grating which couples light out of the detection MMI 200. The light impinges on detectors 540, 550 which can be arranged to receive the light directly or through optical fibers.

Figure 7:
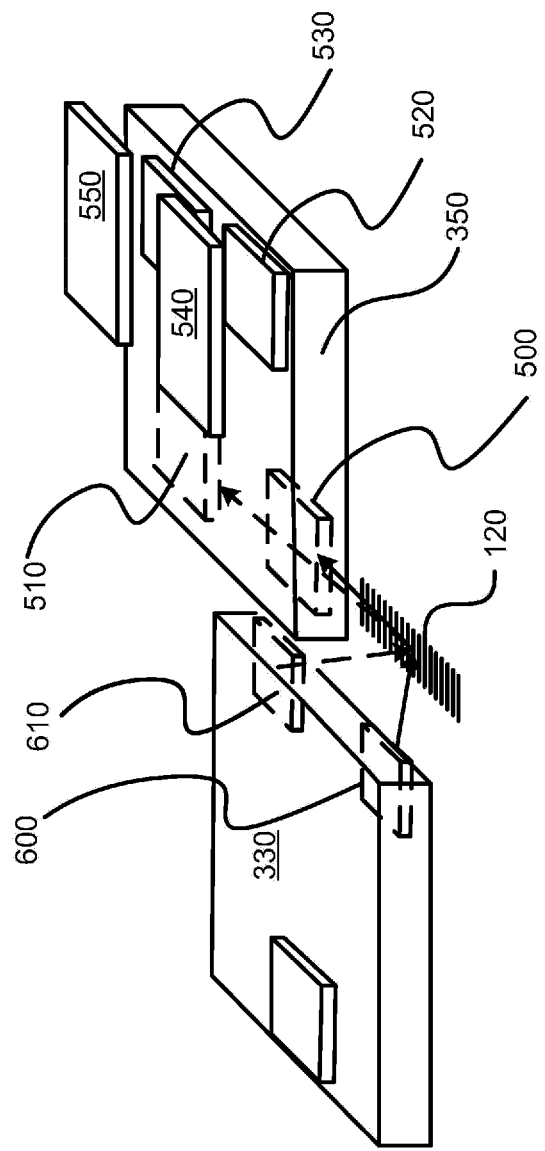
FIG. 7 depicts another arrangement of an MMI illumination device and an MMI detector according to an aspect of an embodiment disclosed herein.

FIG. 7 shows an arrangement in which an illumination MMI 350 has two outputs to provide off-axis illumination of the alignment mark 120. The illumination MMI 350 has two output ports 600, 610. The positive diffraction order impinges on a coupler 500 which is configured as a sub-wavelength structure or grating which couples light into the detection MMI 350. The negative diffraction order impinges on a coupler 510 which is also configured as a subwavelength structure or grating. The diffraction order pairs appear at couplers 520, 530 which are also configured as a sub-wavelength structure or grating which couples light out of the detection MMI 350. The light impinges on detectors 540, 550 which can be arranged to receive the light directly or through optical fibers.

Figure 8:
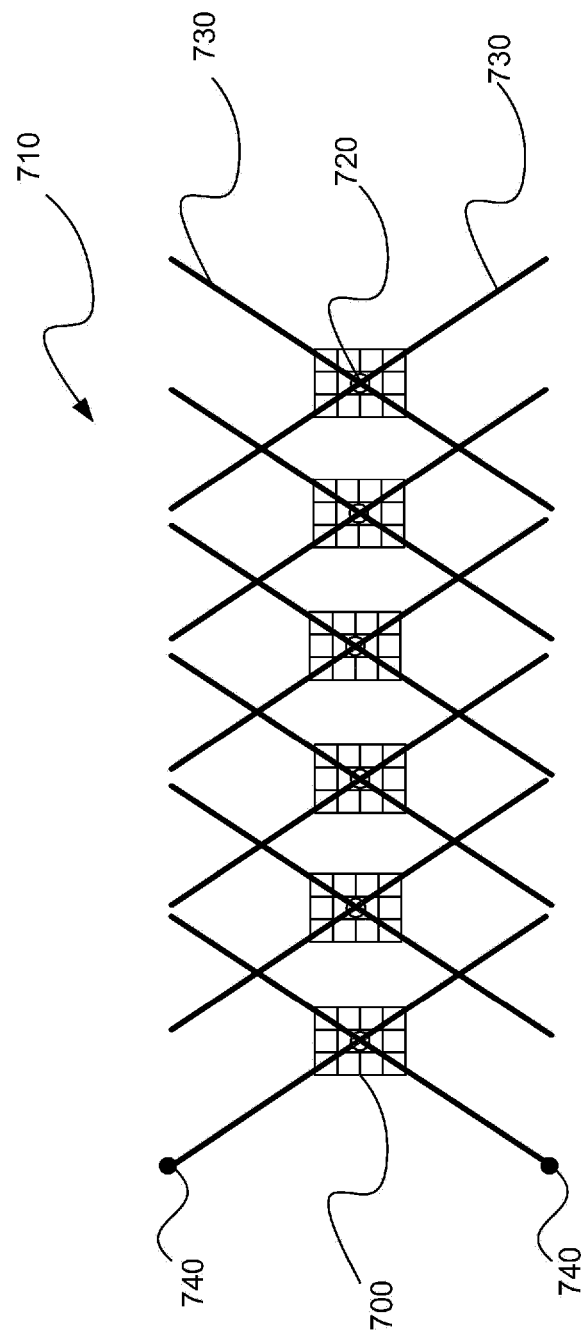
FIG. 8 depicts an arrangement of sensors according to an aspect of an embodiment disclosed herein.

As mentioned, one advantage to the described arrangement is that it can be made to be very compact as compared to existing alignment sensors and so multiple sensors can be arrayed in parallel to cover any field on the wafer as shown in FIG. 4. Several of the sensors may be placed in a row above the wafer and their positions may be individually adjustable, for example, by using screws or, as shown in FIG. 8, by means of a scissors extender which allows to control of the spacing between sensors to be changed simultaneously so that they match the positions of the fields of a specific layer layout on the wafer (in say the X-direction). As shown, a row of integrated optics sensors 700 is positioned in a row above a wafer on a scissor extender 710. The sensors 700 are connected to the scissor extender 710 at branch intersections 720. The lateral position of the sensors is adjustable by moving one or both the externally movable branches 730 of the scissor extender 700 with the branches 740 being fixed. When it is necessary to measure alignment on a wafer with a different spacing of alignment marks, the scissors extender 710 repositions the sensors 700 with respect to one another in the X-direction. All mark positions inside a row of fields (in X) can be addressed by small moves of the wafer below the row of sensor-fields. All rows can be addressed by moving the wafer under the row sensor-fields by a distance of a field in Y.

Figure 9:
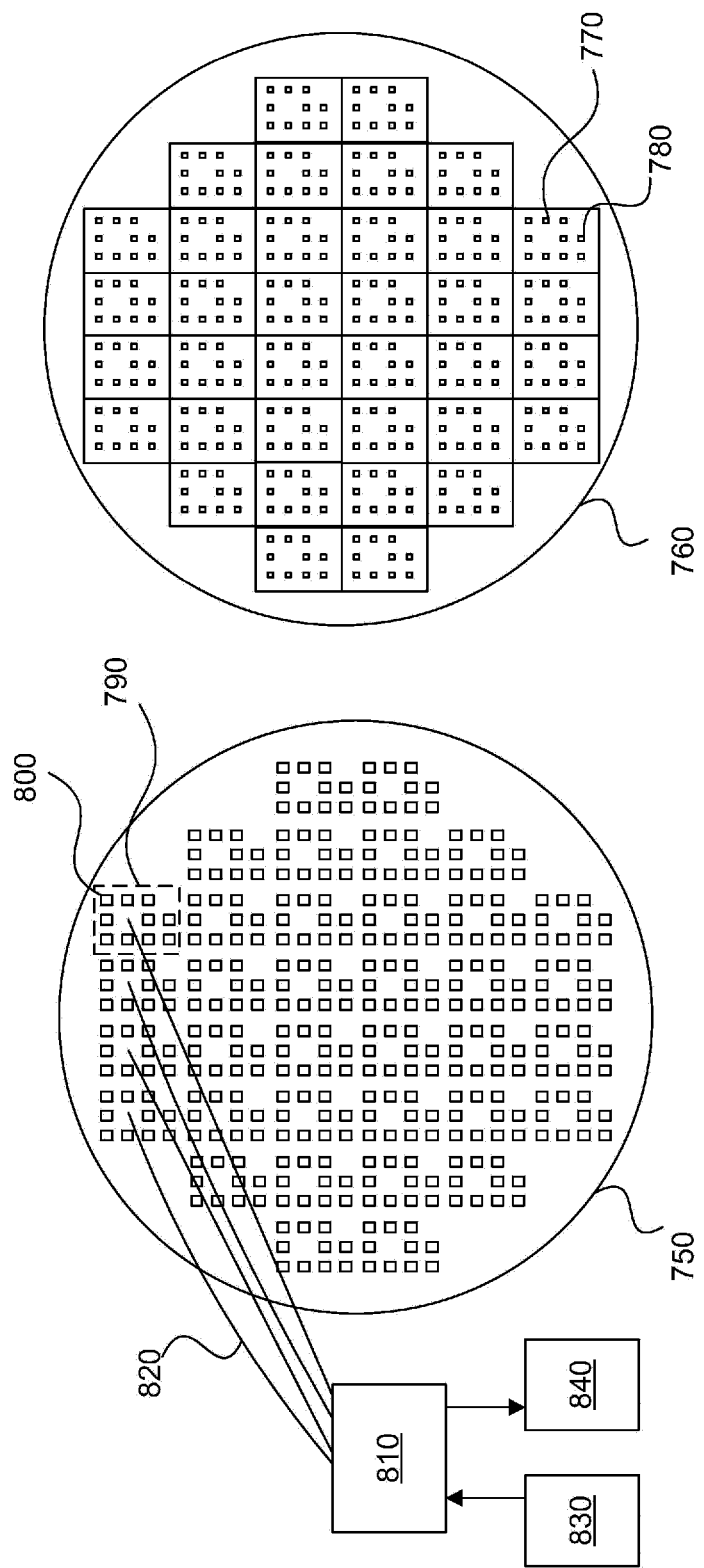
FIG. 9 depicts an arrangement of sensors on a sensor wafer according to an aspect of an embodiment disclosed herein

Because the layout of the alignment marks is fixed per field and per wafer it is possible to use an integrated optic sensor wafer 750 for each layer-layout as shown in FIG. 9. FIG. 9 shows a wafer 760 with an array of fields 770 each having a pattern of alignment marks 780. The sensor wafer 750 is arranged above the wafer 760. The sensor wafer 750 has an array of fields 790 each having an array of sensors 800 in positions corresponding to the positions of the alignment marks 780 on the wafer 760. Each field of sensors 790 is connected to a connector 810 through a respective fiber cable 820, only some of which are shown for clarity. The connector 810 and the fiber cables 820 connect an illumination source 830 and a detector 840 to the sensor wafer 750. It is possible to have such an arrangement because it is not necessary to have the light source or the detector on the sensor-wafer 750. When changing a customer product layout the sensor wafer 750 may be replaced by another sensor wafer dedicated to the layout of the new product. Inside the scanner a storage compartment (such as is used for reticles and wafers) may be provided for the sensor wafers 750.

Figure 10:
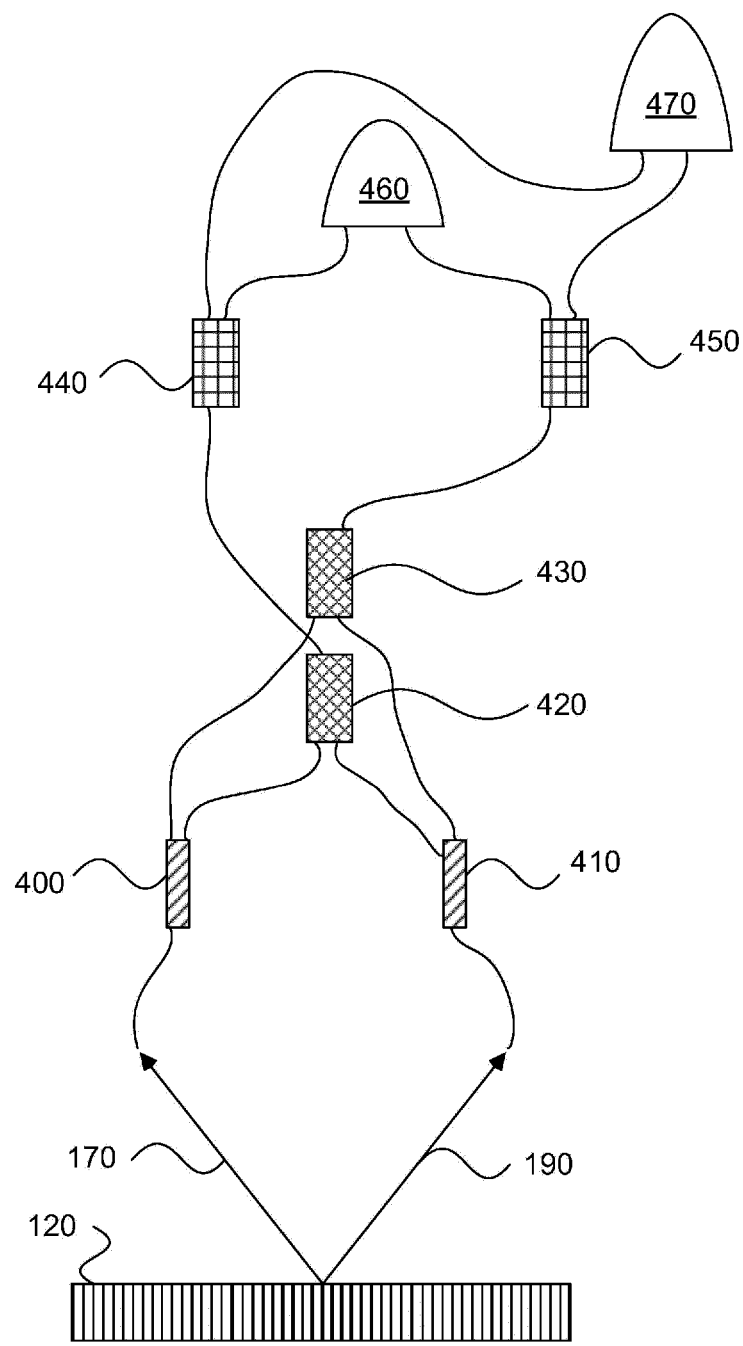
FIG. 10 depicts an optical fiber based alignment sensor according to an aspect of an embodiment disclosed herein.

A system providing similar benefits can also be realized using optical fibers. Such an arrangement is shown in FIG. 10. Optical fibers can be used to collect the +/−diffraction orders. Diffraction order pairs collected by individual fibers can be combined using optical fiber combiners to generate the alignment signal. More specifically and with reference to FIG. 10, the + and − diffraction orders 170 and 190 are respectively coupled into a first fiber based polarization beam splitter 400 and a second fiber based polarization beam splitter 410. The first fiber based polarization beam splitter 400 splits the +diffraction order into an s-polarized beam +_s and a p-polarized beam +_p. Similarly, the second fiber based polarization beam splitter 410 splits the −diffraction order into an s-polarized beam −_s and a p-polarized beam −_p. The beams +_p and −_s are combined in a first fiber based beam combiner 420 to produce a combined (+_p and −_s) beam. The beams −_p and +_s are combined in a second fiber based beam combiner 430 to produce a combined (−_p and +_s) beam. Each combined beam is relayed to a respective fiber/free space based polarization beam splitter/combiner 440, 450 which split the beam. Detectors 460, 470 represent a coherent summation channel and a coherent difference channel, respectively. As above, the scan signal may be processed to extract information about the surface that was scanned. For example, the relative phase between spatially overlapped diffraction order pairs changes with scanning through the mark which results in a modulating signal, from which the aligned position error can be determined. As above, a collection of the fiber-optic based sensors can be arrayed to cover all or some of a field of the alignment grating 120.

The embodiments may further be described using the following clauses:

1. Apparatus for sensing an alignment pattern comprising a grating on a substrate, the apparatus comprising:
   at least one light source for generating a first beam of coherent radiation illuminating a portion of the grating from a first angle and a second beam of coherent radiation illuminating the portion of the grating from a second angle, the first and second beams being diffracted by the portion of the grating; and
   a multimode interference device comprising
   a first input port arranged to receive a positive diffraction order of the first beam and a positive diffraction order of the second beams as diffracted by the grating portion;
   a second input port arranged to receive a negative diffraction order of the first beam and a negative diffraction order of the second beam as diffracted by the grating portion;
   a first output port arranged to output a first spatially overlapped image comprising an image of the grating portion as illuminated by the first beam and a mirror image of the grating portion as illuminated by the second beam; and
   a second output port arranged to output a second spatially overlapped image comprising an image of the grating portion as illuminated by the second beam and a mirror image of the grating portion as illuminated by the first beam.

2. Apparatus of clause 1 further comprising
   a first detector arranged to receive the first spatially overlapped image and to generate a first signal indicative of an intensity of the first spatially overlapped image and
   a second detector arranged to receive the second spatially overlapped image and to generate a second signal indicative of an intensity of the second spatially overlapped image.

3. Apparatus of clause 2 further comprising a processor arranged to receive the first signal the second signal and configured to determine a characteristic of the portion of the grating based at least in part on the first signal and the second signal.

4. Apparatus for sensing an alignment pattern comprising a grating on a substrate, the apparatus comprising:
   at least one light source for generating a first beam of coherent radiation illuminating a portion of the grating from a first angle and a second beam of coherent radiation illuminating the portion of the grating from a second angle, the first and second beams being diffracted by the portion of the grating; and
   a plurality of multimode interference devices, each of the multimode interference devices being arranged adjacent to a respective segment of the grating portion and comprising a first input port arranged to receive a positive diffraction order of the first beam and a positive diffraction order of the second beam as diffracted by the respective segment of the grating portion;
   a second input port arranged to receive a negative diffraction order of the first beam and a negative diffraction order of the second beam as diffracted by the respective segment of the grating portion;
   a first output port arranged to output a first spatially overlapped image comprising an image of the segment of grating portion as illuminated by the first beam and a mirror image of the segment of the grating portion as illuminated by the second beam; and a second output port arranged to output a second spatially overlapped image comprising an image of the segment of the grating portion as illuminated by the second beam and a mirror image of the segment of the grating portion as illuminated by the first beam.

5. Apparatus of clause 4 wherein the plurality of multimode interference devices is arranged in a linear array parallel to the portion of the grating.

6. Apparatus of clause 4 further comprising
a plurality of first detectors respectively arranged to receive the first spatially overlapped images and to generate first signals indicative of intensities of the first spatially overlapped images and
a plurality of a second detectors respectively arranged to receive the second spatially overlapped images and to generate second signals indicative of intensities of the second spatially overlapped images.

7. Apparatus of clause 6 further comprising a processor arranged to receive the first signals the second signals and configured to determine a characteristic of the portion of the grating based at least in part on the first signals and the second signals.

8. Apparatus for sensing an alignment pattern comprising a grating on a substrate, the apparatus comprising:
at least one light source for generating a first beam of coherent radiation illuminating a portion of the grating from a first angle and a second beam of coherent radiation illuminating the portion of the grating from a second angle, the first and second beams being diffracted by the portion of the grating; and
an optical fiber based device comprising
a first input port arranged to receive a positive diffraction order of the first beam and a positive diffraction order of the second beam as diffracted by the grating portion;
a second input port arranged to receive a negative diffraction order of the first beam and a negative diffraction order of the second beam as diffracted by the grating portion;
a first output port arranged to output a first spatially overlapped image comprising a p-polarized image from the negative diffraction orders and an s-polarized image from the positive diffraction orders; and
a second output port arranged to output a second spatially overlapped image comprising an s-polarized image from the negative diffraction orders and a p-polarized image from the positive diffraction orders.

9. Apparatus of clause 8 further comprising
a first detector arranged to receive the first spatially overlapped image and to generate a first signal indicative of an intensity of the first spatially overlapped image and
a second detector arranged to receive the second spatially overlapped image and to generate a second signal indicative of an intensity of the second spatially overlapped image.

10. Apparatus of clause 9 further comprising a processor arranged to receive the first signal the second signal and configured to determine a characteristic of the portion of the grating based at least in part on the first signal and the second signal.

11. Apparatus for sensing an alignment pattern comprising a grating on a substrate, the apparatus comprising:
at least one light source for generating a first beam of coherent radiation illuminating a portion of the grating from a first angle and a second beam of coherent radiation illuminating the portion of the grating from a second angle, the first and second beams being diffracted by the portion of the grating; and
a plurality of an optical fiber based devices each arranged adjacent to a respective segment of the grating portion and comprising
a first input port arranged to receive a positive diffraction order of the first beam and a positive diffraction order of the second beam as diffracted by the grating portion;
a second input port arranged to receive a negative diffraction order of the first beam and a negative diffraction order of the second beam as diffracted by the grating portion;
a first output port arranged to output a first spatially overlapped image comprising a p-polarized image from the negative diffraction orders and an s-polarized image from the positive diffraction orders; and
a second output port arranged to output a second spatially overlapped image comprising an s-polarized image from the negative diffraction order sand orders and a p-polarized image from the positive diffraction orders.

12. Apparatus of clause 11 wherein the plurality of optical fiber based devices is arranged in a linear array parallel to the portion of the grating.

13. Apparatus of clause 12 further comprising
a plurality of first detectors respectively arranged to receive the first spatially overlapped images and to generate first signals indicative of intensities of the first spatially overlapped images and
a plurality of a second detectors respectively arranged to receive the second spatially overlapped images and to generate second signals indicative of intensities of the second spatially overlapped images.

14. Apparatus of clause 13 further comprising a processor arranged to receive the first signals the second signals and configured to determine a characteristic of the portion of the grating based at least in part on the first signals and the second signals.

15. Apparatus for sensing an alignment pattern comprising a grating on a substrate, the apparatus comprising:
at least one light source for generating first and second illumination beams illuminating at least a portion of the grating;
a first input optical element arranged to receive a positive diffraction order of the first beam and a positive diffraction order of the second beam as diffracted by the grating;
a second input optical element arranged to receive a negative diffraction order of the first beam and a negative diffraction order of the second beam as diffracted by the grating;
a first imaging optical element optically coupled to the first input optical element for generating a first image based on the positive diffraction orders;
a second imaging optical element optically coupled to the second input optical element for generating a second image based on the negative diffraction orders;
a first transforming optical element for transforming the first image to generate a first transformed image;
a second transforming optical element for transforming the second image to generate a second transformed image;
a first combining optical element for spatially overlapping the first image and the second transformed image; and
a second combining optical element for spatially overlapping the second image and the first transformed image.

16. Apparatus for sensing an alignment pattern comprising a grating on a substrate, the apparatus comprising:
at least one light source for generating at least one beam of coherent radiation illuminating a portion of the grating, the at least one beam being diffracted by the portion of the grating to produce a diffracted beam; and
a multimode interference device comprising a first input port arranged to receive a positive diffraction order of the diffracted beam;

a second input port arranged to receive a negative diffraction order of the diffracted beam;

a first output port arranged to output a first spatially overlapped image; and a second output port arranged to output a second spatially overlapped image.

17. Apparatus of clause 16 wherein the at least one light source illuminates the portion of the grating on axis.

18. Apparatus of clause 16 wherein the at least one light source illuminates the portion of the grating off axis.

19. Apparatus of clause 16 wherein the first input port comprises a first single mode waveguide and the second input port comprises a second single mode waveguide.

20. Apparatus of clause 16 wherein the a first input port comprises a first subwavelength structure and the second input port comprises a second subwavelength structure.

A system as described above can be used not just to improve overlay alignment but also to diagnose, monitor, and/or adjust scanner performance in general. The scan signal can be analyzed for correlations to key performance indicators for the stepper/scanner. The results of the analysis can be presented and/or stored in any several ways, for example, shown instantaneously on a monitoring device or compiled in a report.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, electromagnetic and electrostatic optical components.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. An apparatus for sensing an alignment pattern comprising a grating on a substrate, the apparatus comprising:
    at least one light source configured to generate a first beam of coherent radiation illuminating a portion of the grating from a first angle and a second beam of coherent radiation illuminating the portion of the grating from a second angle, the first and second beams being diffracted by the portion of the grating; and
    a multimode interference device comprising:
        a first input port arranged to receive a positive diffraction order of the first beam and a positive diffraction order of the second beam as diffracted by the grating portion;
        a second input port arranged to receive a negative diffraction order of the first beam and a negative diffraction order of the second beam as diffracted by the grating portion;
        a first output port arranged to output a first spatially overlapped image comprising an image of the grating portion as illuminated by the first beam and a mirror image of the grating portion as illuminated by the second beam; and
        a second output port arranged to output a second spatially overlapped image comprising an image of the grating portion as illuminated by the second beam and a mirror image of the grating portion as illuminated by the first beam.

2. The apparatus of claim 1, further comprising:
    a first detector arranged to receive the first spatially overlapped image and to generate a first signal indicative of an intensity of the first spatially overlapped image; and a second detector arranged to receive the second spatially overlapped image and to generate a second signal indicative of an intensity of the second spatially overlapped image.

3. The apparatus of claim 2, further comprising a processor configured to receive the first signal and the second signal and to determine a characteristic of the portion of the grating based at least in part on the first signal and the second signal.

4. An apparatus for sensing an alignment pattern comprising a grating on a substrate, the apparatus comprising:
at least one light source configured to generate a first beam of coherent radiation illuminating a portion of the grating from a first angle and a second beam of coherent radiation illuminating the portion of the grating from a second angle, the first and second beams being diffracted by the portion of the grating; and
a plurality of multimode interference devices, each of the multimode interference devices being arranged adjacent to a respective segment of the grating portion and comprising:
a first input port arranged to receive a positive diffraction order of the first beam and a positive diffraction order of the second beam as diffracted by the respective segment of the grating portion;
a second input port arranged to receive a negative diffraction order of the first beam and a negative diffraction order of the second beam as diffracted by the respective segment of the grating portion;
a first output port arranged to output a first spatially overlapped image comprising an image of the segment of the grating portion as illuminated by the first beam and a mirror image of the segment of the grating portion as illuminated by the second beam; and
a second output port arranged to output a second spatially overlapped image comprising an image of the segment of the grating portion as illuminated by the second beam and a mirror image of the segment of the grating portion as illuminated by the first beam.

5. The apparatus of claim 4, wherein the plurality of multimode interference devices is arranged in a linear array parallel to the portion of the grating.

6. The apparatus of claim 4, further comprising:
a plurality of first detectors respectively arranged to receive the first spatially overlapped images and to generate first signals indicative of intensities of the first spatially overlapped images; and
a plurality of second detectors respectively arranged to receive the second spatially overlapped images and to generate second signals indicative of intensities of the second spatially overlapped images.

7. The apparatus of claim 6, further comprising a processor configured to receive the first signals and the second signals and to determine a characteristic of the portion of the grating based at least in part on the first signals and the second signals.

8. An apparatus for sensing an alignment pattern comprising a grating on a substrate, the apparatus comprising:
at least one light source configured to generate a first beam of coherent radiation illuminating a portion of the grating from a first angle and a second beam of coherent radiation illuminating the portion of the grating from a second angle, the first and second beams being diffracted by the portion of the grating; and
an optical fiber based device comprising:
a first input port arranged to receive a positive diffraction order of the first beam and a positive diffraction order of the second beam as diffracted by the grating portion;
a second input port arranged to receive a negative diffraction order of the first beam and a negative diffraction order of the second beam as diffracted by the grating portion;
a first output port arranged to output a first spatially overlapped image comprising a p-polarized image from the negative diffraction orders and an s-polarized image from the positive diffraction orders; and
a second output port arranged to output a second spatially overlapped image comprising an s-polarized image from the negative diffraction orders and order sand a p-polarized image from the positive diffraction orders.

9. The apparatus of claim 8, further comprising:
a first detector arranged to receive the first spatially overlapped image and to generate a first signal indicative of an intensity of the first spatially overlapped image; and
a second detector arranged to receive the second spatially overlapped image and to generate a second signal indicative of an intensity of the second spatially overlapped image.

10. The apparatus of claim 9, further comprising a processor configured to receive the first signal and the second signal and to determine a characteristic of the portion of the grating based at least in part on the first signal and the second signal.

11. An apparatus for sensing an alignment pattern comprising a grating on a substrate, the apparatus comprising:
at least one light source configured to generate a first beam of coherent radiation illuminating a portion of the grating from a first angle and a second beam of coherent radiation illuminating the portion of the grating from a second angle, the first and second beams being diffracted by the portion of the grating; and
a plurality of optical fiber based devices each arranged adjacent to a respective segment of the grating portion and comprising:
a first input port arranged to receive a positive diffraction order of the first beam and a positive diffraction order of the second beam as diffracted by the grating portion;
a second input port arranged to receive a negative diffraction order of the first beam and a negative diffraction order of the second beam as diffracted by the grating portion;
a first output port arranged to output a first spatially overlapped image comprising a p-polarized image from the negative diffraction orders and an s-polarized image from the positive diffraction orders; and
a second output port arranged to output a second spatially overlapped image comprising an s-polarized image from the negative diffraction orders and order sand a p-polarized image from the positive diffraction orders.

12. The apparatus of claim 11, wherein the plurality of optical fiber based devices is arranged in a linear array parallel to the portion of the grating.

13. The apparatus of claim 12, further comprising
a plurality of first detectors respectively arranged to receive the first spatially overlapped images and to generate first signals indicative of intensities of the first spatially overlapped images; and a plurality of second detectors respectively arranged to receive the second spatially overlapped images and to generate second signals indicative of intensities of the second spatially overlapped images.

14. The apparatus of claim 13, further comprising a processor configured to receive the first signals and the second signals and to determine a characteristic of the portion of the grating based at least in part on the first signals and the second signals.

15. An apparatus for sensing an alignment pattern comprising a grating on a substrate, the apparatus comprising:
at least one light source configured to generate at least one beam of coherent radiation illuminating a portion of the grating, the at least one beam being diffracted by the portion of the grating to produce a diffracted beam; and
a multimode interference device comprising:
a first input port arranged to receive a positive diffraction order of the diffracted beam;
a second input port arranged to receive a negative diffraction order of the diffracted beam;
a first output port arranged to output a first spatially overlapped image; and
a second output port arranged to output a second spatially overlapped image
wherein the first input port comprises a first single mode waveguide and the second input port comprises a second single mode waveguide.

16. The apparatus of claim 15, wherein the at least one light source illuminates the portion of the grating on axis.

17. The apparatus of claim 15, wherein the at least one light source illuminates the portion of the grating off axis.

18. The apparatus of claim 15, wherein the first input port comprises a first subwavelength structure and the second input port comprises a second subwavelength structure.

* * * * *

UNITED STATES PATENT AND TRADEMARK OFFICE
CERTIFICATE OF CORRECTION

PATENT NO. : 11,531,280 B2
APPLICATION NO. : 17/271684
DATED : December 20, 2022
INVENTOR(S) : Elazhary et al.

It is certified that error appears in the above-identified patent and that said Letters Patent is hereby corrected as shown below:

In the Specification

In Column 11, Line 54, delete "7E" and insert -- $\pi$ --, therefor.

In Column 16, Line 16, after "diffraction", delete "order sand".

In the Claims

In Column 20, Claim 8, Line 16, after "and", delete "order sand".

In Column 20, Claim 11, Line 58, after "and", delete "order sand".

In Column 20, Claim 13, Line 63, delete "comprising" and insert -- comprising: --, therefor.

Signed and Sealed this
Eighteenth Day of June, 2024

Katherine Kelly Vidal
*Director of the United States Patent and Trademark Office*